United States Patent
Kwan et al.

(10) Patent No.: US 6,781,451 B2
(45) Date of Patent: *Aug. 24, 2004

(54) SWITCHED-CAPACITOR, COMMON-MODE FEEDBACK CIRCUIT FOR A DIFFERENTIAL AMPLIFIER WITHOUT TAIL CURRENT

(75) Inventors: Tom W. Kwan, Cupertino, CA (US); Ralph Duncan, Laguna Beach, CA (US); Frank W. Singor, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/425,719

(22) Filed: Apr. 30, 2003

(65) Prior Publication Data

US 2003/0201825 A1 Oct. 30, 2003

Related U.S. Application Data

(63) Continuation of application No. 09/921,000, filed on Aug. 3, 2001, now Pat. No. 6,577,184.
(60) Provisional application No. 60/223,280, filed on Aug. 3, 2000, and provisional application No. 60/224,168, filed on Aug. 9, 2000.

(51) Int. Cl.[7] .................................................. H03F 1/02

(52) U.S. Cl. .......................................... 330/9; 330/258

(58) Field of Search ............................ 327/9, 258, 254, 327/278, 290, 291, 337, 554, 74, 75, 307; 330/253, 258, 9, 254, 278, 290, 291

(56) References Cited

U.S. PATENT DOCUMENTS

| | | | |
|---|---|---|---|
| 4,849,662 A | * | 7/1989 | Holberg et al. ............... 327/554 |
| 4,992,755 A | | 2/1991 | Seevinck et al. ............. 330/253 |
| 5,710,563 A | | 1/1998 | Vu et al. ....................... 341/161 |
| 5,864,257 A | | 1/1999 | Rothenberg .................. 330/253 |
| 5,894,284 A | | 4/1999 | Garrity et al. ................ 327/337 |
| 5,963,156 A | | 10/1999 | Lewicki et al. ................ 327/94 |
| 6,337,651 B1 | | 1/2002 | Chiang ......................... 341/161 |
| 6,362,688 B1 | | 3/2002 | Au ................................ 330/253 |

FOREIGN PATENT DOCUMENTS

EP         0 380 152 A1      8/1990

OTHER PUBLICATIONS

International Search Report issued Jul. 24, 2003 for Appln. No. PCT/US01/41576, 4 pages .

* cited by examiner

*Primary Examiner*—Tuan T. Lam
(74) *Attorney, Agent, or Firm*—Sterne, Kessler, Goldstein & Fox P.L.L.C.

(57) ABSTRACT

Provided is a switched capacitor feedback circuit including two or more input ports configured to receive a corresponding a number of input signals and at least one output port. The output port is configured to output an adjusting signal. The input signals includes a number of primary signals and two or more reference signals that are associated with a first timing phase of operation. The adjusting signal is produced based upon a comparison between the primary signals the reference signals. Also provided is a pair of active devices having gates coupled together and structured to receive the adjusting signal. The active devices are configured to provide a gain to the adjusting signal in accordance with a predetermined gain factor, and facilitate an adjustment to the number of primary signals based upon the gain during a second timing phase of operation.

11 Claims, 13 Drawing Sheets

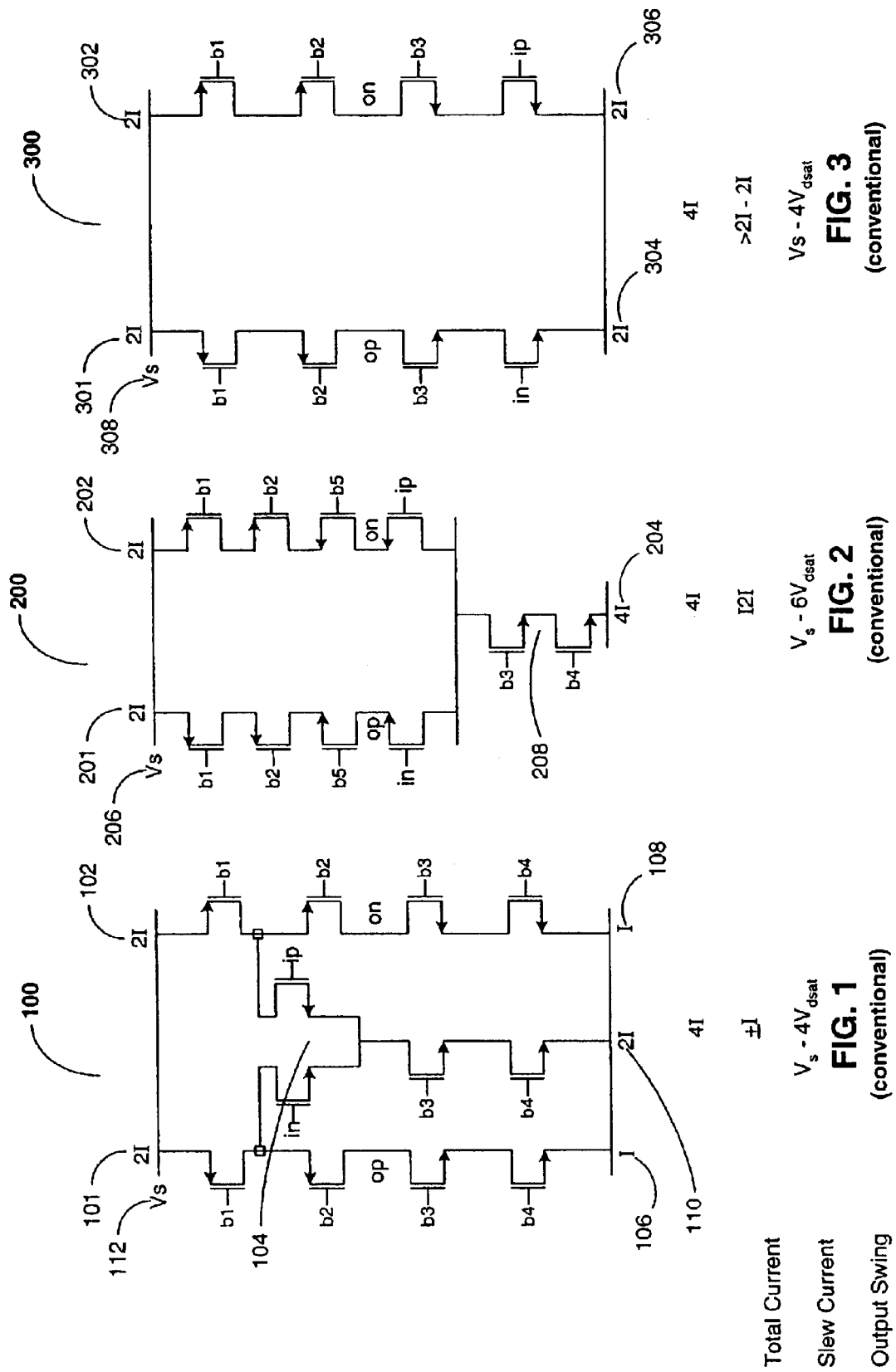

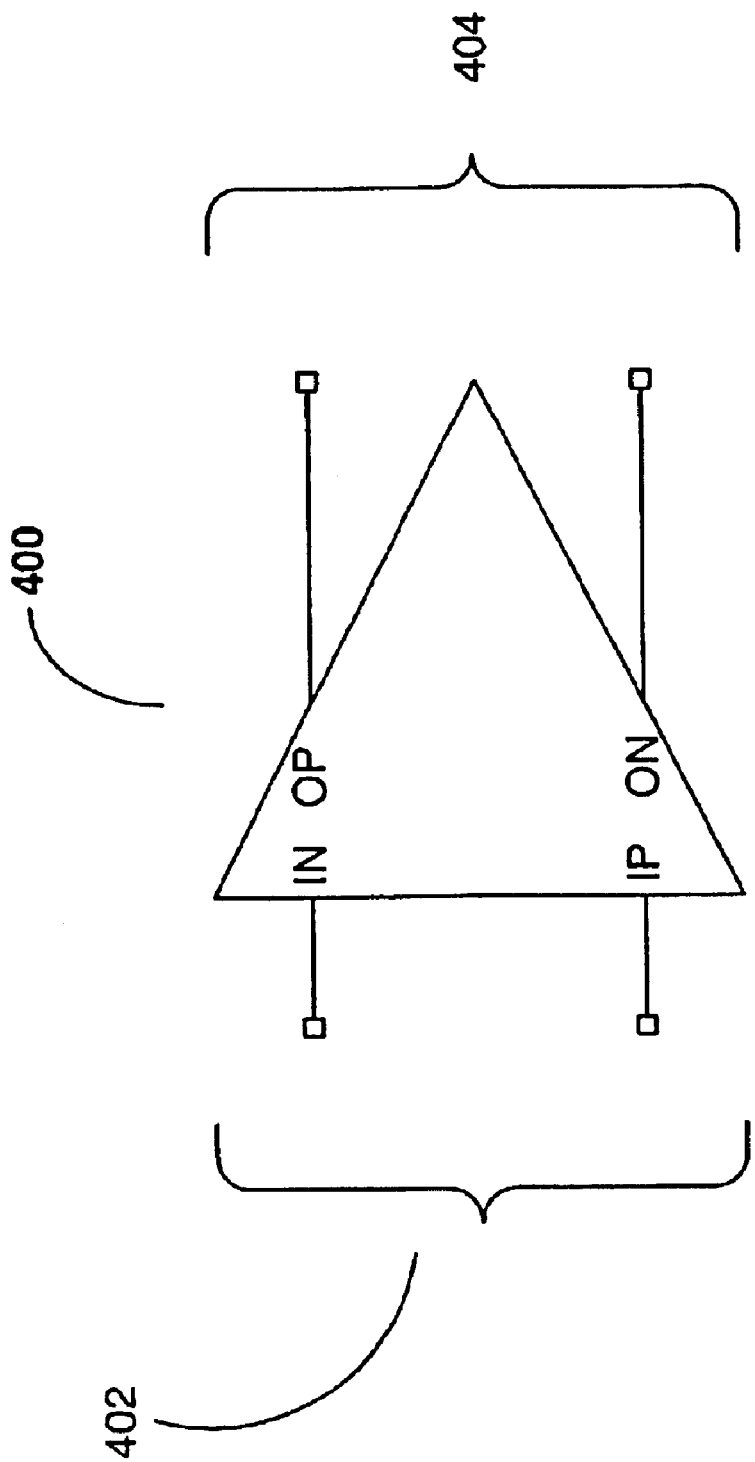
FIG. 4
(conventional)

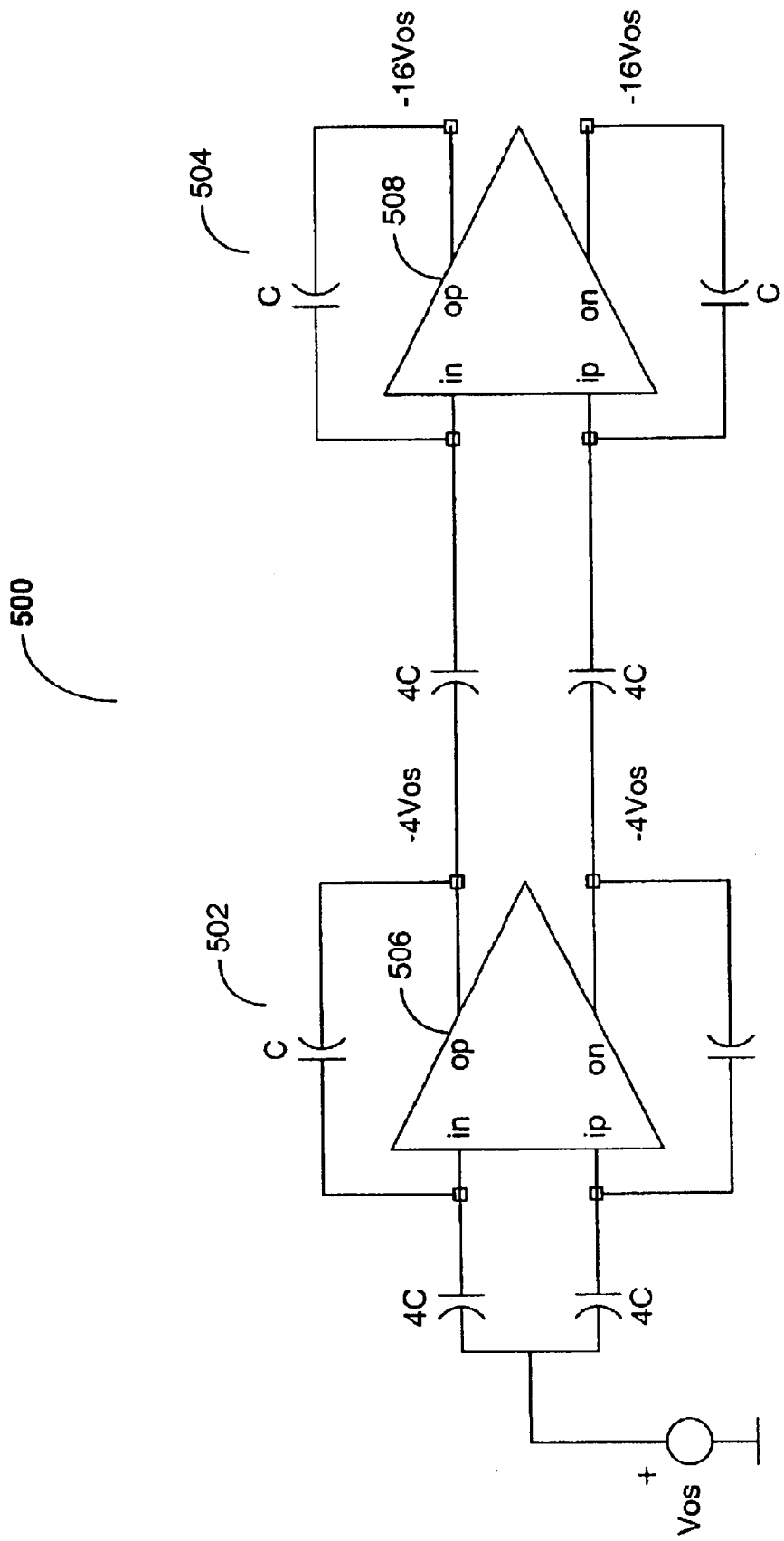
FIG. 5
(conventional)

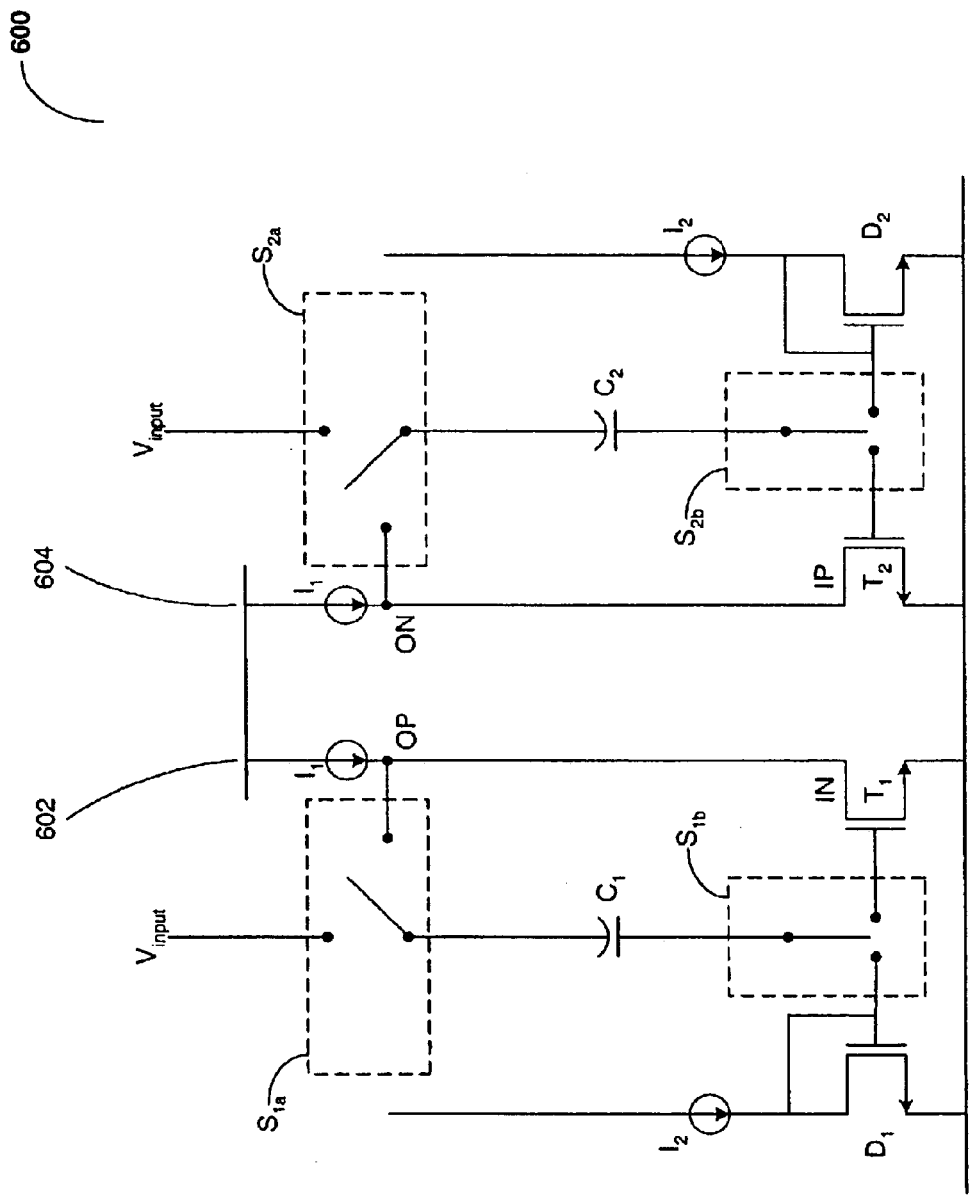
FIG. 6A
(conventional)

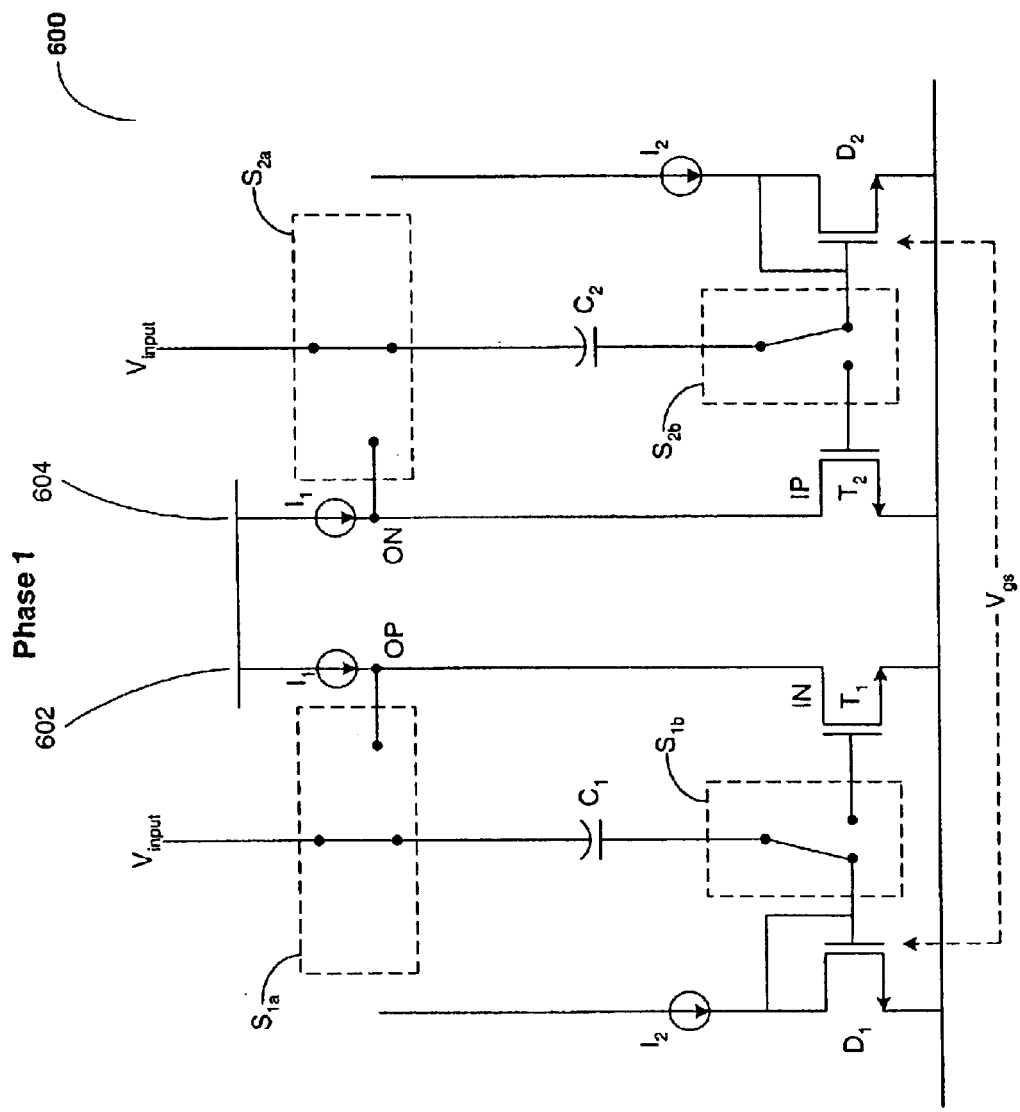
FIG. 6B (conventional)

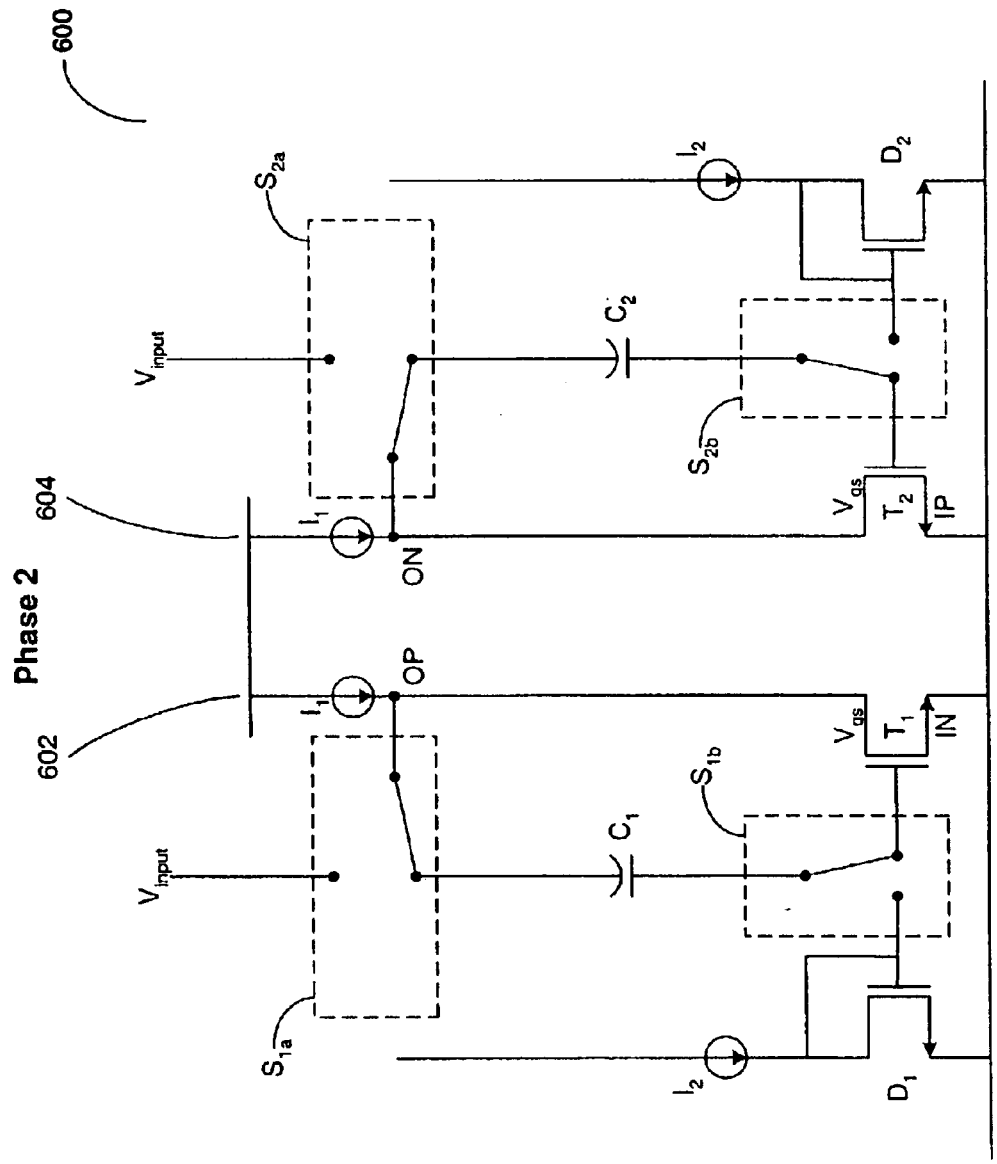
FIG. 6C
(conventional)

Phase 1

Phase 2

SWITCHED-CAPACITOR, COMMON-MODE FEEDBACK CIRCUIT FOR A DIFFERENTIAL AMPLIFIER WITHOUT TAIL CURRENT

CROSS-REFERENCE TO RELATED APPLICATIONS

This application is a continuation of the U.S. Non-Provisional Application entitled "A Switched-Capacitor, Common-Mode Feedback Circuit For a Differential Amplifier Without Tail Current," Ser. No. 09/921,000, filed Aug. 3, 2001, now U.S. Pat. No. 6,577,184 which claims priority to U.S. Provisional Application No. 60/223,280, filed Aug. 3, 2000, and U.S. Provisional Application No. 60/224,168, filed Aug. 9, 2000, all of which are incorporated herein in their entireties by reference.

BACKGROUND OF THE INVENTION

1. Field of the Invention

The present invention generally relates to a circuit for a differential amplifier. More particularly, the present invention relates to a system and method for controlling output-common-mode voltages in differential amplifiers without tail currents.

2. Background Art

An important advantage in transitioning to finer-geometry complementary metal oxide (CMOS) processes is the ability to use low-voltage power supplies, which corresponds to a lower-power operating environment. Although CMOS processes fulfill the need for low-power operating requirements and consumption, a need still exists to be able to achieve large signal swings from these CMOS amplifiers in order to maintain adequate signal-to-noise ratios. Several conventional approaches to providing differential amplifiers with reasonably large output swings exist. A few of these traditional approaches are discussed in greater detail below.

Several metrics exist for rating and measuring the overall performance of differential amplifiers. Among these metrics are total current, slew current, and output swing. As known in the art, differential amplifiers include an inverting input and a non-inverting input and corresponding inverting and non-inverting outputs. The total current for differential amplifiers, therefore, is measured by adding the absolute value of the current detected at both the inverting and non-inverting outputs.

Slew current is defined as the amount of current detected at one amplifier output port when completely tilting one input to the other. Typically, slew current is used as a measure of an amplifier's efficiency. Another important metric is the output swing, which is a measure of how far the amplifier can go from rail to rail before it begins losing gain. Although a number of different techniques exist for providing large signal output swings in CMOS amplifiers, each of these techniques suffers from at least one major disadvantage.

For example, while certain amplifiers maybe able to produce large output swings, these same amplifiers may be slow or inefficient. Other amplifiers that may be faster, may sacrifice efficiency for speed. Finally, other amplifiers that may provide reasonably large output swings and high efficiency, may be unable to reject output common-mode voltage disturbances. Common-mode voltage, as understood in the art, may be created as a result of imbalances in transistor performance and power supply variations. Common-mode voltage may also result from the input source directly or from a previous amplification stage.

Although particular types of differential amplifiers provide tail current sources as an effective technique for resolving problems associated with common-mode voltages, tail current sources create inefficiencies and inherently reduce headroom swing in these amplifiers. Therefore, a need exists to be able to derive high output swings from low-power power supplies in CMOS differential amplifiers without tail current sources.

BRIEF SUMMARY OF THE INVENTION

Consistent with the principles of the present invention as embodied and described herein, an embodiment of the invention includes a switched capacitor feedback circuit configured to switch between two or more timing phases of operation. The circuit includes (i) a plurality of input ports configured to receive a corresponding plurality of input signals therethrough, and (ii) at least one output port configured to output an adjusting signal. Next, the corresponding plurality of input signals includes a number of primary signals and two or more reference signals. The adjusting signal is produced based upon a comparison between the number of primary signals and at least one of the reference signals, the comparison occurring during a first of the timing phases. Finally, the primary signals are adjusted in accordance with the adjusting signal during a second of the timing phases.

Another embodiment of the invention includes a switched capacitor feedback circuit including (i) a plurality of input ports configured to receive a corresponding plurality of input signals therethrough, and (ii) at least one output port, the output port being configured to output an adjusting signal. The corresponding plurality of input signals includes a number of primary signals and two or more reference signals, all of the signals being associated with a first timing phase of operation. The adjusting signal is produced based upon a comparison between the number of primary signals and at least one of the reference signals. Also included is a pair of active devices having gates thereof coupled together, the gates being configured to receive the adjusting signal. The active devices are configured to (i) provide a gain to the adjusting signal in accordance with a predetermined gain factor, and (ii) facilitate an adjustment to the number of primary signals based upon the gain during a second timing phase of operation.

Features and advantages of the present invention include an ability to control or eliminate output common-mode voltage variations in a differential amplifier without the need of providing a tail current source. This approach facilitates the realization of differential amplifiers with larger output swings that are low-power, fast, and operate efficiently.

BRIEF DESCRIPTION OF THE FIGURES

The accompanying drawings, which are incorporated in and constitute a part of the specification, illustrate an embodiment of the present invention and, together with the description, explain the purpose, advantages, and principles of the invention. In the drawings:

FIG. 1 is a simplified circuit diagram of a conventional folded cascode differential amplifier;

FIG. 2 is a simplified circuit diagram of a conventional telescopic differential amplifier with a tail current source;

FIG. 3 is a simplified circuit diagram of a conventional telescopic differential amplifier without a tail current source;

FIG. 4 depicts a conventional operational amplifier symbol representing the circuit of FIG. 3;

FIG. 5 depicts the circuit arrangement of FIG. 4 used in a cascode amplifier;

FIG. 6A is an illustration of a conventional switched capacitor circuit arrangement used in a telescopic amplifier without tail current;

FIG. 6B is an illustration of the switched capacitor circuit of FIG. 6A during a first timing phase;

FIG. 6C is an illustration of the switched capacitor circuit of FIG. 6A during a second timing phase;

DETAILED DESCRIPTION OF THE INVENTION

Figure 7:
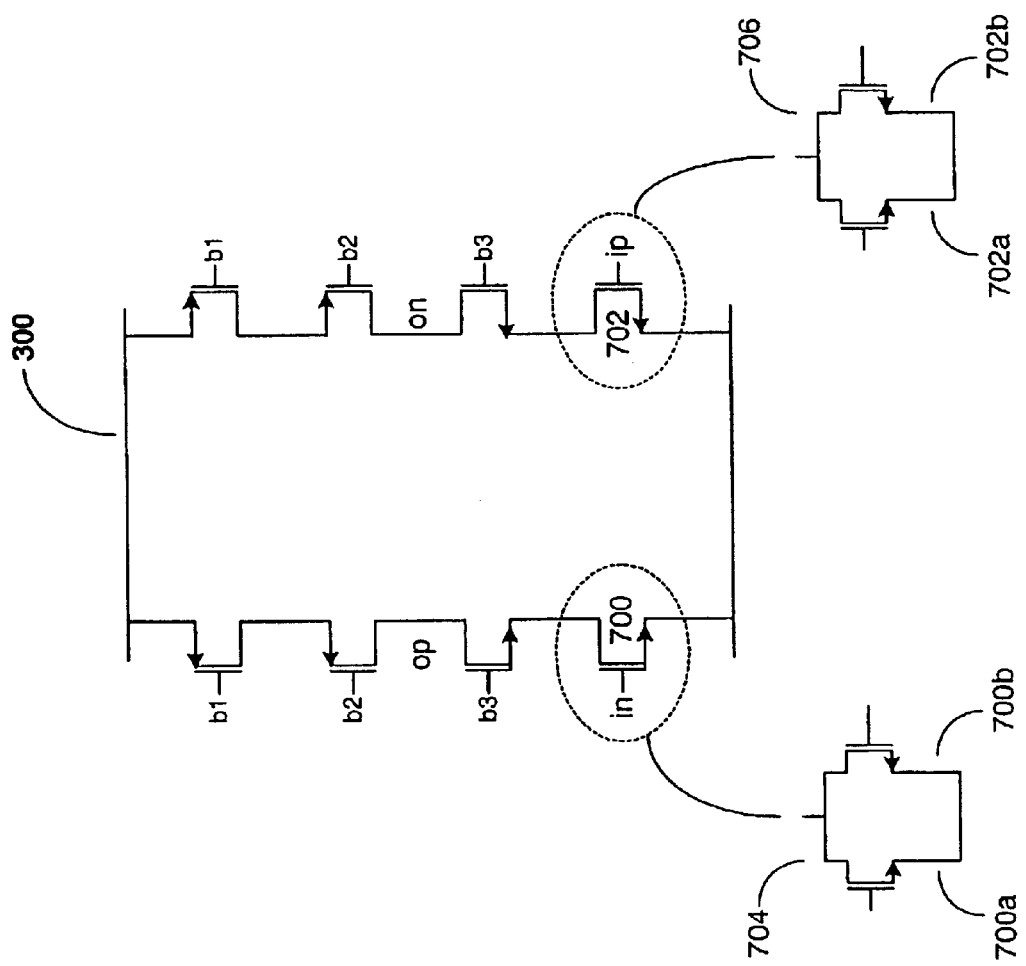
FIG. 7 is an illustration of a split input transistor technique used in the present invention.

The following detailed description of the present invention refers to the accompanying drawings that illustrate exemplary embodiments consistent with this invention. Other inventions are possible, and modifications may be made to the embodiments without departing from the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, and/or firmware, in the entities illustrated in the figures. The actual hardware used to implement the present invention is not limiting of the present invention. Thus, the operation and behavior of the present invention will be described with the understanding that modifications and variations of the embodiments are possible, given the level of detail present herein.

FIG. 1 illustrates a conventional folded cascode amplifier 100, having a maximum non-inverting output current 101 of 2I and a maximum inverting output current 102, also equal to 2I, for total current output of 4I. Although the folded cascode amplifier 100 has reasonably high total output current, the amplifier 100 is inefficient. Its slew current, described above, is ±I. The slew current is produced by disconnecting one of the amplifier inputs and measuring the amount of current tilting to, or that can be measured at, the other input. Given a total current of 4I, and a slew current of ±I, the amplifier 100 has an efficiency of about 25%.

Another disadvantage of the folded cascode amplifier 100 is that it is comparatively slow. That is, any input signal provided at inverting input port IN and non-inverting input port IP must travel around a loop 104 prior to amplification. The signal requires time to completely traverse this loop, thereby creating a slower response time for the amplifier 100. However, the folded cascode amplifier 100 has a reasonably high output swing of $V_S - 4V_{dsat}$. $V_S$ is the supply voltage. $V_{dsat}$ is a measure of the source to drain voltage of each of the amplifiers required for each transistor stage to remain in saturation while the amplifier continues to provide full gain.

FIG. 2 is an illustration of a straight telescopic amplifier 200. The amplifier 200 provides a total non-inverting current output 201 of 2I and a total inverting output current 202 of 2I. Thus, the total current of the telescopic amplifier 200 is the same as the folded cascode amplifier 100, 4I, but the slew current is twice as large. The telescopic amplifier 200, however, is faster than the cascade amplifier 100 because it eliminates the signal loop 104 shown in the amplifier 100. Thus, the amplifier 200 consumes the same amount of current as the amplifier 104, but has the advantage of being faster. One disadvantage, however, is that the total output swing of the amplifier 200 is $V_S - 6V_{dsat}$, lower than that of the output swing of the amplifier 100. As stated above, the amplifier 100 has an output swing of $V_S - 4V_{dsat}$. Additionally, the amplifier 200 includes a tail current source 208 for controlling common-mode output gain. The tail current source 208 is a fixed bias voltage, which helps reject common-mode voltages. Tail currents are undesirable, however, because of the inherent inefficiencies discussed above.

FIG. 3 shows a telescopic amplifier 300 without a tail current. The amplifier 300 provides a total current output of 4I, equal to the total current output of amplifiers 100 and 200. Further, it does not have the input loop 204 of the amplifier 100, thus providing an operational speed equivalent to the amplifier 200. Yet, the amplifier 300 has an output swing of $V_S - 4V_{dSAT}$, which is greater than the output swing of the amplifier 200. Thus, the amplifier 300 offers the features and advantages of the folded cascode amplifier 100 and the straight telescopic amplifier 200 without the need for a tail current. However, without a tail current, the amplifier 300 is unable to reject output to common-mode voltages due to the input source or caused by the previous stage.

FIG. 4 illustrates a conventional use of differential amplifiers, such as the telescopic amplifier 300. In particular, FIG. 4 shows how the telescopic amplifier 300 can be used to form an operational amplifier 400 having respective inverting and non-inverting input ports IN and IP. Also included are respective inverting and non-inverting differential output ports OP and ON. As known in the art, differential amplifiers operate upon the principle that each differential input is sensitive to the opposite polarity of the other. That is, when the non-inverting input receives a positive signal and the inverting input inverts the positive signal to form a negative version thereof, then an output is produced which is equal to a difference between the two signals multiplied by some gain. On the other hand, if both inputs receive a signal having the same value and polarity, an output signal will not be produced, since these two input signals will cancel one another out. Input signals having the same polarity at both inputs are known as common-mode inputs. Thus, it can be said that differential amplifiers have an inherent ability to reject such common-mode signals since the difference between these two signals is zero, which causes the signals to cancel one another out.

An inherent common mode rejection ability alone, however, is not sufficient to reject common-mode type signals created by offsets or variations in transistor amplification characteristics. That is, transistors forming inverting and non-inverting amplifier input stages may not be precisely matched in their amplification characteristics. One design solution is to offset the characteristics of one transistor to compensate for the amplification characteristics of the other. An undesirable by-product of these offsets is that they are also amplified along with actual input signals, which unnecessarily consumes useful amplifier head-room. For amplifiers having a small amount of gain, such as a gain of 1, the offsets will not create significant problems. However, in telescopic amplifiers without tail currents in a cascoded configuration, such as the operational amplifier 400, offsets are problematic since gains of respective individual amplifiers will be combined.

FIG. 5 shows a conventional cascode amplifier 500 including two amplification stages, 502 and 504. The stages 502 and 504 include amplifiers 506 and 508. Each amplifier 506 and 508 has a gain of 4, thus yielding a total gain of 16 for the amplifier 500. Therefore, in the amplifier 500, the signal level of desirable signals will be multiplied by a factor of 16 during amplification. However, unwanted signals produced by offsets in the amplification stage 502, will also be multiplied by the factor of 16. These amplified unwanted signals (i.e., offsets) often behave as common-mode voltage signals which significantly reduce amplification characteristics, such as dynamic range and head-room of the amplifier 500. Therefore, although telescopic amplifiers without tail currents inherently reject common-mode voltages, these amplifiers still remain vulnerable to the effects of common-mode type offset voltages.

One conventional technique used to further enhance the common-mode rejection characteristics of telescopic amplifiers is switched capacitor interpolation circuits. Switched capacitor interpolation circuits are routinely used in conjunction with a reference voltage source to further attenuate the effects of output common-mode voltages. As stated above, however, such arrangements are ineffective against offset voltages which may occur as the capacitors of the switched capacitor circuits dump charges from phase to phase transitions, or because of differences in amplification characteristics of the associated transistors. The operation of a conventional telescopic amplifier using a switched capacitor circuit is explained below.

FIGS. 6A–6C illustrate different operational phases of a conventional telescopic amplifier without tail current, using a switched capacitor circuit. FIG. 6A depicts a telescopic amplifier 600 having respective differential non-inverting and inverting amplification sides 602 and 604. The non-inverting amplification side 602 includes a transistor $T_1$ having a gate acting as an inverting input port IN. Also included is a non-inverting output port OP, a current source $I_1$, a capacitor $C_1$, and capacitor switches $S_{1a}$ and $S_{1b}$. A current source $I_2$, providing substantially the same level of current as the current source $I_1$, is provided, along with a diode $D_1$ configured to provide a diode voltage. The diode $D_1$, the current source $I_2$, the capacitor $C_1$, and the capacitor switches $S_{1a}$ and $S_{1b}$ are provided as part of the switched capacitor arrangement discussed above. Finally, a voltage source $V_{INPUT}$ is included to provide a reference voltage.

In FIG. 6A, the switches $S_{1a}$ and $S_{1b}$ are shown to be in a neutral unswitched configuration. Similar to the non-inverting amplification side 602, the non-inverting side 604 includes a transistor $T_2$ having a gate forming a non-inverting input port IP, an output port ON, and another current source $I_1$. Also included is another diode $D_2$, another current source $I_2$, another capacitor $C_2$, and capacitor switches $S_{2a}$ and $S_{2b}$. Finally, another reference voltage source $V_{INPUT}$ is provided. In the input sides 602 and 604, the switches $S_{1a}$ and $S_{1b}$ are provided to respectively connect terminals of the capacitor $C_1$ to the diode $D_1$ and the voltage $V_{INPUT}$ during one timing phase, and to switch the capacitor ends to connect to the gate of the transistor $T_1$ and the output OP during another timing phase. Correspondingly, in the input side 604, the switches $S_{2a}$ and $S_{2b}$ switch the terminals of the capacitor $C_2$ from being connected to the diode $D_2$ and the voltage $V_{INPUT}$ during one phase, to having the transistor $T_2$ and the output ON during the other phase.

As known in the art, traditional switch cap circuits operate through two timing phases (i.e., phase 1 and phase 2). Operation of the telescopic amplifier 600 during phase 1 of the switched capacitor circuit is more clearly illustrated in FIG. 6B.

FIG. 6B shows phase 1 of the switched capacitor circuit as mentioned above. During phase 1, the switches $S_{1a}$ and $S_{1b}$ are configured to provide the voltage $V_{INPUT}$ on one side of the capacitor $C_1$ while connecting the other side of the capacitor $C_1$ to the diode $D_1$, as shown. As part of a known technique to attenuate common-mode output voltage, the diode $D_1$, which is a field effect transistor (FET) configured as a diode, is provided to mirror the characteristics of transistor $T_1$. Similarly, the current source 12 mirrors the current value of the current source $I_1$, of the amplification side 602. As stated above, the objective of the switch capacitor, the diode $D_1$, and the current source $I_2$, is to attenuate common-mode output voltages provided at the output port OP, limiting these voltages to a value substantially equal to the value $V_{INPUT}$.

Therefore, during phase 1, the capacitor $C_1$ is connected to have the input voltage source $V_{INPUT}$ at one terminal, and the diode $D_1$ connected at its other terminal. When activated, the current source 12 produces a voltage Vgs across a gate of diode $D_1$ as shown in FIG. 6B. Similarly, during phase 1, the switches $S_{2a}$ and $S_{2b}$ are configured to connect the input voltage $V_{INPUT}$ to one side of $C_2$ and connect the diode $D_2$ to its other side, as shown in the figure. In the circuit of FIG. 6B, the characteristics of the diode $D_1$ and transistor $T_1$ respectively mirror the characteristics of diode $D_2$ and transistor $T_2$.

During phase 1, when the capacitor $C_2$, which is substantially the same value as capacitor $C_1$, is connected to and thereby charged with the input voltage $V_{INPUT}$, the current source 12 of the amplification side 604 also produces the voltage Vgs across a gate of the diode $D_2$. Therefore, during phase 1, the capacitor $C_1$ is charged with a voltage value functionally related to the input voltage $V_{INPUT}$ and the voltage Vgs. Similarly, the capacitor $C_2$ is charged with a voltage value functionally related to the input voltage $V_{INPUT}$ and the voltage value Vgs, also produced across diode $D_2$. During phase 2, however, the switched capacitor circuit switches the capacitor $C_1$ so that the capacitor $C_1$ is now inserted (i.e., parked) across the output terminal OP and the input terminal IN of the input side 602. Similarly, during phase 2, the switches $S_{2a}$ and $S_{2b}$ are configured to park the capacitor $C_2$ across the output ON and the gate of transistor $T_2$ of the input side 604.

FIG. 6C shows phase 2 of the switched capacitor circuit. As shown and stated above, during phase 2, the switches, $S_{1a}$ and $S_{1b}$ respectively switch the capacitor $C_1$ so that it is parked across the output OP and the input IN of the input side 602. Similarly, during phase 2 the switches $S_{2a}$ and $S_{2b}$ switch the capacitor $C_2$, so that it is parked across the output ON and the input IP of the input side 604. Therefore, the voltages that were applied to $C_1$ during phase 1, $V_{INPUT}$ and Vgs, may now be applied across the output terminal OP and the input terminal IN, respectively. Using this technique, during phase 2, the output voltage provided at the output terminal OP will now be held to the value related to $V_{INPUT}$, Vgs and the value Vgs will be provided at the input port IN, regardless of the presence of any common-mode voltage. The same process applies to the input side 604 with respect to the operation of the capacitor $C_2$, the switch $S_{2a}$ and the switch $S_{2b}$. This switched capacitor circuit technique creates the effect of attenuating output common-mode voltages that are produced at the outputs OP and ON.

The diode voltage Vgs is used as a reference voltage to control the level of the input and output common-mode voltage associated with the input sides 602 and 604 of the amplifier 600. This technique is effective as long as characteristics associated with the diode $D_1$ carefully match those same characteristics associated with the transistor $T_1$. Specifics of this technique will be discussed in detail with regard to the input side 602 only, although it is understood that this technique also applies to the input side 604.

The gate characteristics associated with the diode $D_1$ must carefully match those of the gate of the transistor $T_1$, such that when the current source $I_2$ is used to set up the diode voltage Vgs across the diode gate, substantially the same voltage Vgs is also produced at the gate of the transistor $T_1$, which will be a function of the current source $I_1$. Therefore, when the capacitor $C_1$ switches from phase 1 to phase 2 and imparts Vgs across the gate of the transistor $T_1$ and $V_{INPUT}$ across the terminal OP, the output common-mode voltage is held to the value of $V_{INPUT}$. That is, the output common-mode voltage can be attenuated and held to the voltage level $V_{INPUT}$ as long as the characteristics of the diode $D_1$ gate match those of the gate of transistor $T_1$. If this relationship holds true, then when the capacitor $C_1$ changes from phase 1 to phase 2, the diode voltage Vgs will be the same at the diode gate and the transistor gate.

Switched capacitor techniques are effective for reducing common-mode voltages when the characteristics of the amplifier's transistors are carefully matched. This technique, however, is not effective when imbalances, offsets, and/or differences in gate characteristics between the diode and the transistor gate exist. In other words, the technique illustrated in FIGS. 6A–6C is only effective at attenuating common-mode voltage in telescopic amplifiers without tail current. Therefore, an improved technique is needed.

In the present invention, the inventors have discovered that by building upon the common-mode rejection technique of FIGS. 6A–6C, amplifiers without tail currents may be provided with techniques that not only attenuate common-mode voltages, but also compensate for the effects of common-mode offsets.

Figure 8:
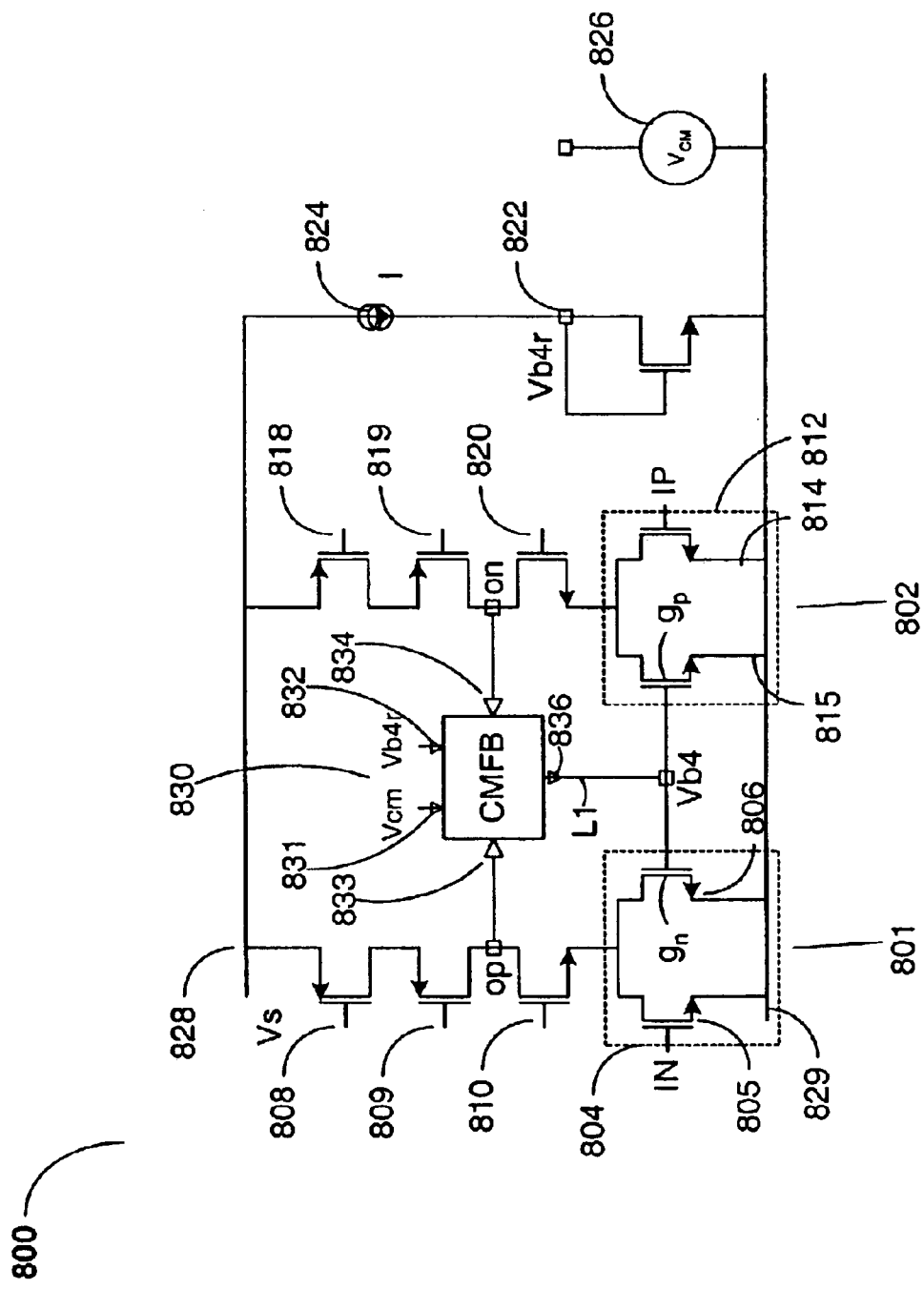
FIG. 8 is schematic diagram of a circuit constructed and arranged in accordance with an embodiment of the present invention.

FIG. 7 illustrates that any traditional amplifier without a tail current, such as the telescopic amplifier 300 shown in FIG. 3, can be modified to compensate for the effects of common-mode offsets. A first step in this modification requires that the amplifiers' input stage transistors, 700 and 702, be divided into transistor pairs 704 and 706 respectively. As noted, the transistor 700 is split into transistors 700a and 700b. That is, the gain characteristics associated with the single transistor 700 are divided between the two transistors 700a and 700b of the transistor pair 704. Further, the gain characteristics of transistor 702 are divided between the transistors 702a and 702b of the transistor pair 706. As will be described in greater detail below, the transistor pairs 702 and 704 may be used in conjunction with other circuit components to carefully control the input and output common-mode voltages associated with traditional amplifiers that do not have tail currents. FIG. 8 illustrates an exemplary implementation of the split transistor technique shown in FIG. 7.

In FIG. 8, an exemplary amplifier 800 is constructed and arranged in accordance with a preferred embodiment of the present invention. The amplifier 800 is a modified telescopic differential amplifier although the present invention may be used with any differential amplifier that does not have a tail current. In the exemplary amplifier 800, the transistors are metal oxide semiconductor field-effect transistor (MOSFET) devices of the N-channel (NMOS) variety. The present invention, however, is not limited to NMOS transistors. In FIG. 8, the amplifier 800 includes respective first and second amplification sides 801 and 802. The amplification side 801 includes an amplifier inverting input stage 804 having a signal input transistor 805 with its gate forming an input labeled "IN" and a companion transistor 806. Also included in the input side 801, are transistors 808–810 representing individual amplification stages. A non-inverting output labeled "OP" is provided to output a differential signal.

Similarly, the input side 802 includes anon-inverting amplifier input stage 812 having an input transistor 814 with its gate forming a non-inverting input terminal labeled "IP" along with a companion transistor 815. Gates $g_n$ and $g_p$ of the respective companion transistors 806 and 815, are connected together. Also included in the input side 802 are input stage transistors 818–820. The amplifier 800 includes a first voltage source 822 for providing a reference voltage $V_{b4r}$, a current source 824 providing a current $I_1$, a second voltage source 826 for providing a signal representative of a desired fixed common-mode voltage level $V_{cm}$, and a supply voltage source $V_S$. Common nodes 828 and 829 are provided to electrically connect the input sides 801 and 802 and their associated components.

As readily observed from FIG. 8, the input stages 804 and 812 are constructed of differential pair transistors respectively formed from transistor pairs 805, 806 and 814, 815. As explained above, the differential pair transistors 805, 806 and 814, 815 maybe formed by splitting input stage transistors, such as the transistors 700 and 702 shown in FIG. 7. The idea is to divide the gain characteristics of the single transistor, in a conventional differential amplifier, across the transistor pair. In the exemplary embodiment of FIG. 8, the sources of transistors 805, 806, 814 and 815 are all connected to a common node 829 of the amplifier 800. Additionally, one end of the voltage source 826 and an anode side of the diode voltage source 822 are also connected to the common node 829. As shown, the gates $g_n$ and $g_p$ of transistors 806 and 815 are coupled to the connecting line L1 and are both structured to receive an adjusting voltage signal $V_{b4}$.

Also as shown in FIG. 8, drains of the transistors 805 and 806 are connected together and are coupled to the source of transistor 810. Similarly, the drains of transistors 814 and 815 are connected together and are coupled with the source of transistor 820. The supply voltage $V_S$ is provided to the common node 828 to provide an operational voltage to the amplifier 800.

Finally, the amplifier 800 includes a common-mode feedback circuit 830, provided in cooperative arrangement with the outputs OP and ON and the input stages 804 and 812. The common-mode feedback circuit 830 cooperates with the amplifier input stages 804 and 812 and provides a feedback loop to attenuate the effects of common-mode offset voltages produced at the outputs OP and ON. The feedback circuit 830 includes input ports 833 and 834 for respectively receiving signals produced at the output ports OP and ON. Also included are input ports 831 and 832 for receiving respective voltage signals $V_{cm}$ and $V_{b4r}$. Finally, an output port 836 provides the adjusting voltage $Vb_4$ along the output line $L_1$. The voltage $V_{b4}$ is injected into the gates $g_n$ and $g_p$ of the respective transistors 806 and 815. More specifically, the common-mode feedback circuit 830 monitors the actual output common-mode voltage provided at the outputs OP and ON. The circuit 830 then compares the actual common-mode voltage occurring at OP and ON with the fixed desirable voltage $V_{cm}$ and correspondingly adjusts the common-mode output voltage, using $V_{b4}$ to change the output common-mode voltage to the desirable voltage level.

The common-mode feedback circuit 830 is known in the art as a switched capacitor circuit. Thus, the common-mode feedback circuit 830 includes two sets of capacitors that are alternately switched between the various input and output ports shown in FIG. 8. The input stages 804 and 812 are configured to adjust an input common-mode voltage based upon an output from the common-mode feedback circuit 830 in a predetermined manner. The common-mode feedback circuit 830 is described more fully with reference to the illustration of FIG. 9. Similarly, the operation of the input stages 804 and 812 will be described more fully in reference to the illustrations shown in FIGS. 10A and 10B.

Figure 9:
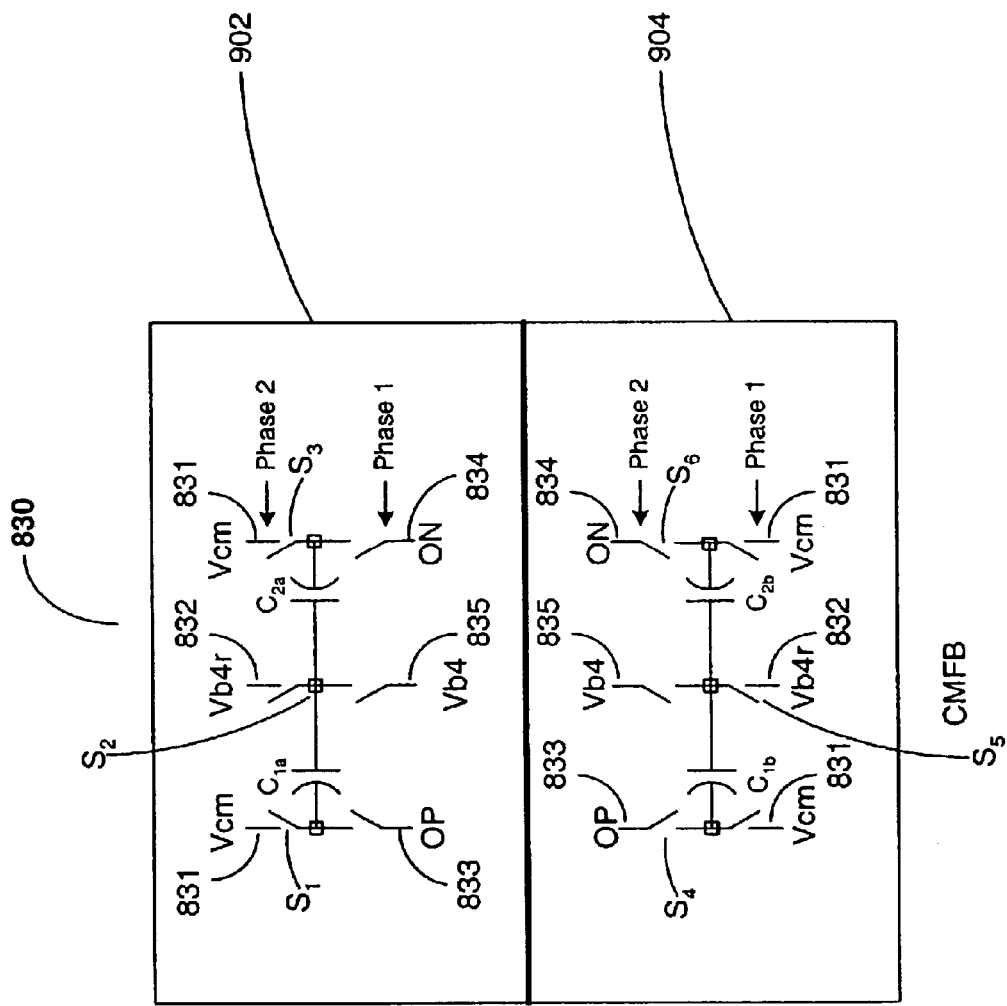
FIG. 9 depicts a switched capacitor circuit configuration used in the embodiment of FIG. 8.

FIG. 9 is a schematic diagram of the switchable capacitors included in the common-mode feedback circuit 830. The switched capacitor circuit 830 includes respective first and second capacitor sets 902 and 904. During operation of the amplifier 800, the capacitor sets 902 and 904 are switched between the various amplifier inputs and outputs in a ping-pong like fashion. In this manner, at least one set of capacitors always remains connected across the amplifier inputs and outputs to avoid the creation of an open loop circuit condition.

In particular, the first set of capacitors 902 includes respective first and second capacitors $C_{1a}$ and $C_{2b}$ and associated switches $S_1$–$S_3$ for switching the capacitors $C_{1a}$ and $C_{2a}$ between first and second timing phases. For example, the capacitors $C_{1a}$ and $C_{2a}$ are switched from being connected to the output ports OP, $V_{b4}$, and ON during a first timing phase of operation, to being connected to $V_{cm}$ and $V_{b4}$ during a second timing phase. Similarly, the second set of capacitors 904 includes individual capacitors $C_{1b}$ and $C_{2b}$ as well as switches $S_4$–$S_6$ for alternately connecting the capacitors $C_{1b}$ and $C_{2b}$ between the first and second timing phases discussed above. In the exemplary embodiment of FIG. 9, the capacitors $C_{1b}$ and $C_{2b}$ are switched from the output ports $V_{cm}$ and $V_{b4r}$ during phase 1, to the outputs OP, $V_{b4}$, and ON, during phase 2.

Figure 10B:
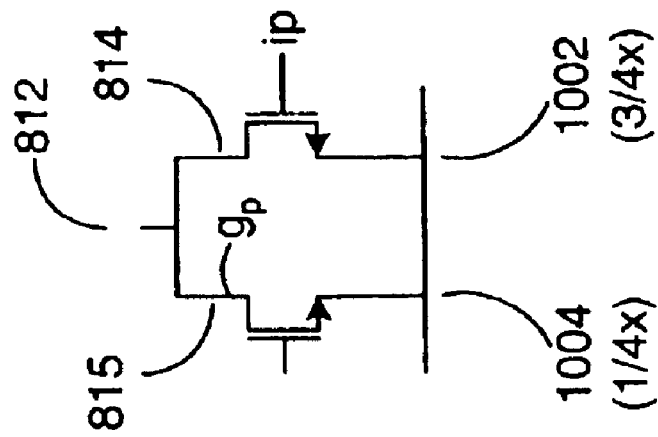
FIG. 10B is an illustration of exemplary gain factor relationships associated with a second set of split input transistors in the circuit of FIG. 8.
Figure 10A:
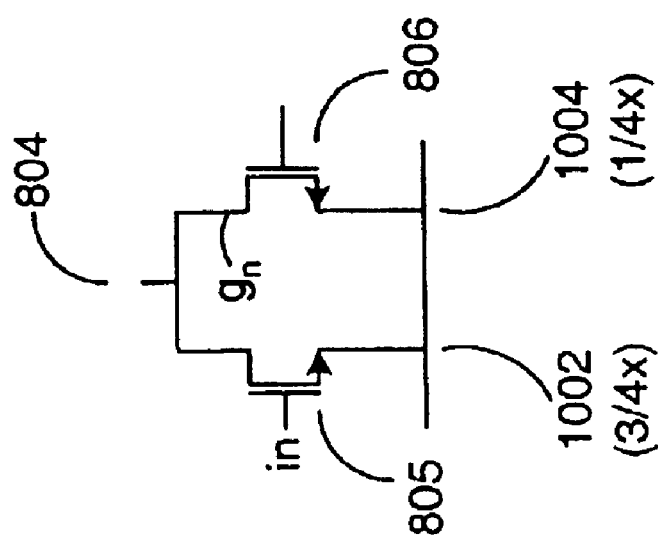
FIG. 10A is an illustration of exemplary gain factor relationships associated with a first set of split input transistors in the circuit of FIG. 8.

FIGS. 10A and 10B provide simplified illustrations of the input stages 804 and 812 depicted in FIG. 8. FIGS. 10A and 10B, with reference to FIG. 7 discussed above, illustrate how transistor input amplification characteristics are divided between respective input transistors 805 and 814 of the input stage 804 and 812 and the respective companion transistors 806 and 815. As shown from the illustration of FIG. 8, the gates $g_n$ and $g_p$ of the companion transistors 806 and 815 are coupled to the output port 836 of the common-mode feedback circuit 830. Connected in this manner, the companion transistors 806 and 815 are configured to receive the adjustment voltage $V_{b4}$, produced by the common-mode feedback circuit 830 along the output line L1. Having received the adjusting voltage $V_{b4}$ the companion transistor 806 and 815 may then adjust the common-mode voltage level, measured at the output ports OP and ON, by some predetermined amount.

A characteristic unique to common-mode voltage signals is that they have the same polarity on both the input and output sides of amplifiers. On this basis, unwanted common-mode voltage signals can be distinguished from useful differential-mode voltage signals and can therefore be separately processed by the amplifier. That is, differential-mode voltage signals are not attenuated in the exemplary embodiment of FIG. 8. Only common-mode voltage signals are effected. In FIG. 8, the input stage transistors 805 and 814 are configured to amplify a common-mode input signal in accordance with a predetermined gain, for example driving its signal level from a first value to a second higher value. The companion transistors 806 and 815, however, based upon the output from the common-mode feedback circuit 830, will drive the signal level to a lower value by the predetermined amount discussed above.

Thus, the common-mode feedback circuit 830 and the input stages 804 and 812 form a feedback path to sample the output common-mode voltage from OP and ON, compare the sampled voltage with the voltage $V_{cm}$ and produce the adjusting signal $V_{b4}$ as a result. The companion transistors 806 and 815 receive this adjusting voltage signal and adjust the voltage level of the output common-mode signal by the predetermined set amount. This process, explained in greater detail below, carefully controls the output common-mode voltage. The present invention is thus configured to lower the output common-mode voltage level when the common-mode output voltage is too high, as compared to the desirable reference voltage $V_{cm}$. Alternatively, the present invention is also configured to raise the output common-mode voltage level when the output common-mode voltage is lower than $V_{cm}$.

In FIGS. 10A and 10B, the transistor pairs 805/814 and 806/815 are structured to provide complimentary gain values in order to process the input and output differential and common-mode voltage signals. The transistor pairs 805/814 and 806/815 thus operate in accordance with respective gain factors 1002 and 1004. For purposes of illustration only, ¾× and ¼× have been respectively chosen for the factors 1002 and 1004. It should be understood, however, that any factors may be chosen as long as their sum is substantially equal to one (e.g., ⅖ & ⅗, ½ & ½, and ⅓ & ⅔ etc.). The gain factor 1002 and the corresponding transistors 805 and 814 are used to provide amplification for the useful differential-mode signals received at the input ports IN and IP respectively. On the other hand, however, the gain factor 1004 and the associated transistors 806 and 815 are used to compliment the operation of transistors 805 and 814 and to adjust the output common-mode voltage. Specifically, the transistors 806 and 815 are used to either attenuate or amplify the common-mode voltage provided to the output ports OP and ON, based upon a comparison with the fixed level voltage signal $V_{cm}$. This principle is illustrated more clearly in the example of FIG. 11.

Figure 11:
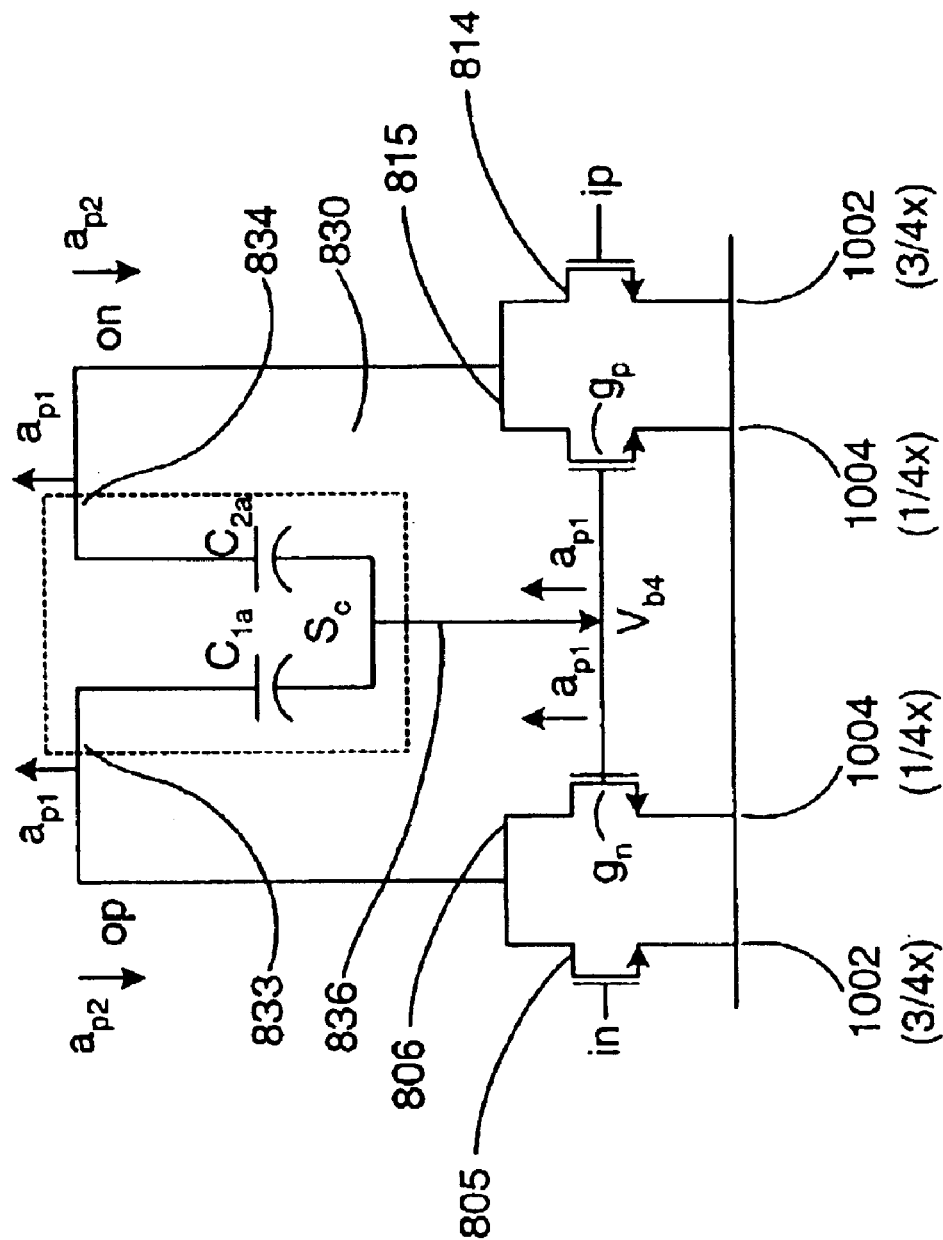
FIG. 11 illustrates the operation of the switched capacitor circuit and the split transistors in the embodiment of FIG. 8.

FIG. 11 explains the operation of the present invention. In FIG. 11 when output signals are delivered to the output ports OP and ON of the amplifier 800, they are also respectively provided as inputs to the input ports 833 and 834 of the common-mode feedback circuit 830. When received at the input ports 833 and 834, an actual common-mode voltage level of these signals is measured and compared with the desirable common-mode voltage signal $V_{cm}$ supplied by the voltage source 826. In practice, the capacitors $C_{1a}$ and $C_{2a}$ hold an amount of charge acquired during a previous phase, based on the voltage $V_{cm}$. When the capacitors $C_{1a}$ and $C_{2a}$ are connected across the outputs OP and ON, their charge voltage, substantially equal to $V_{cm}$, pulls the adjusting voltage $V_{b4}$, up or down, based upon the level of the actual common-mode voltage present in the output signals received at the ports 833 and 834.

If the actual output common-mode voltage is higher than $V_{cm}$ during phase 1, for example, as indicated by the up arrows $a_{P1}$ at the input ports 833 and 834, then the common-mode feedback circuit 830 reacts to adjust the output common-mode voltage level. Specifically, if the common-mode voltage at the input port 833 and 834 is too high, the common-mode feedback circuit 830 produces a correcting signal $S_C$. $S_C$ has the voltage level of $V_{b4}$ and is produced to provide the needed adjustment to the common-mode output voltage level. The correcting signal $S_C$ is injected into the gates $g_n$ and $g_p$ of the transistors 806 and 815.

The transistors 806 and 814 behave as inverting amplifiers. Therefore, in response to the gates $g_n$ and $g_p$ going up, during phase 2, the common-mode voltage produced at the outputs OP and ON, is correspondingly drawn down, as represented by the arrows $a_{P2}$. Thus, whenever the output common-mode voltage at the output ports OP and ON is higher than $V_{cm}$ during one phase, the common-mode feedback circuit 830 and the transistors 806 and 815 cooperate to reduce the common-mode voltage during the next phase.

On the other hand, if the common-mode output voltage is lower than $V_{cm}$, then the common-mode feedback circuit 830 and the transistors 806 and 815 cooperate to increase the output common-mode voltage in association with the gain factor 1004. During the next phase, input signals received at the input ports IN and IP are amplified based upon the gain factor 1002. Thus in the exemplary embodiment of FIG. 11, the input differential-mode signals will be amplified by a nominal gain moderated by the factor ¾×. The present invention, therefore, provides a feedback loop operating between phase 1 and phase 2 of the switch capacitor circuitry to dynamically adjust the output common-mode voltage. In this manner, the effects of common-mode type voltage offsets can be minimized.

FIGS. 12A–13B provide a more detailed illustration of the operation of the common-mode feedback circuit 830 and the input stages 804 and 812. Although discussed above, with respect to FIGS. 6A–6C, the operation of switch capacitor circuits will be repeated in this section for purposes of review. First, referring briefly to FIG. 9, the switch capacitor circuits are configured to operate during timing phases 1 and 2. As shown in FIG. 9 the capacitors $C_{1a}$, $C_{2a}$, $C_{1b}$, and $C_{2b}$, and the switches $S_1$–$S_6$, are ping-ponged in and out of the common-mode feedback circuit 830 in accordance with the phases 1 and 2.

Figure 12A:
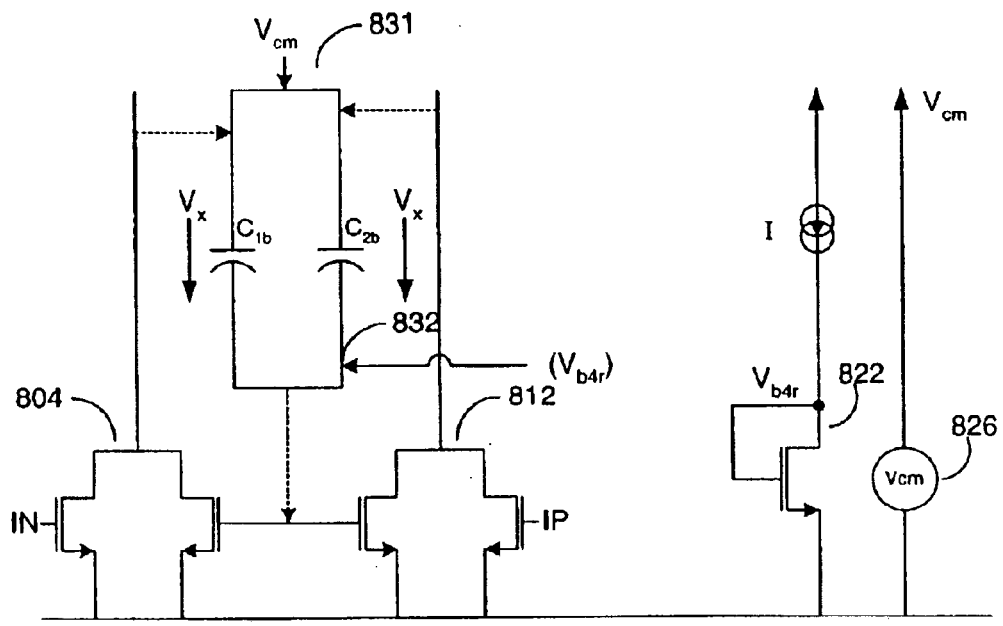
FIG. 12A depicts a first set of switchable capacitors configured for operation during timing phase 1.
Figure 12B:
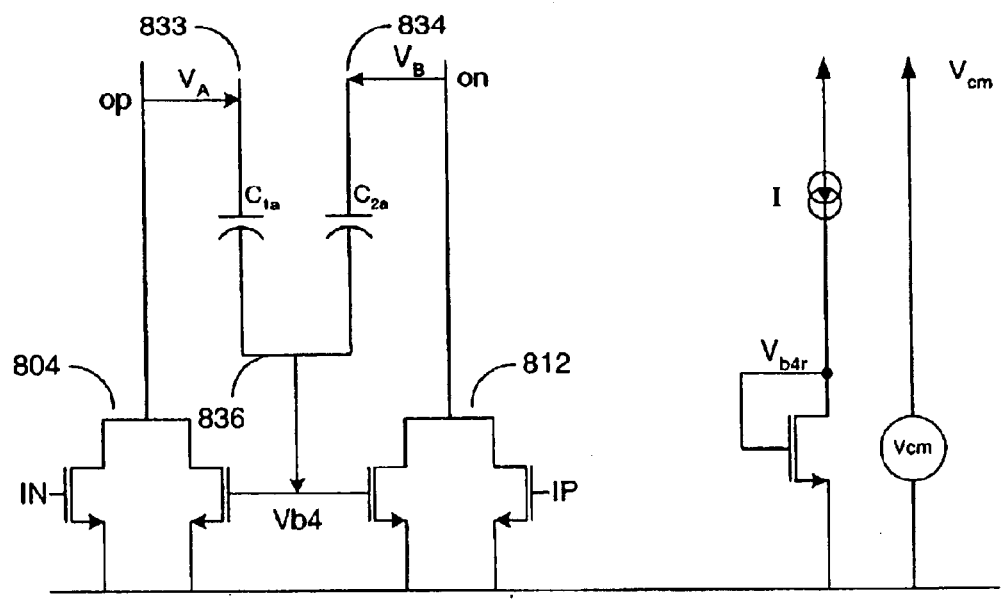
FIG. 12B depicts a second set of switchable capacitors configured for operation during timing phase 1.

During phase 1, all of the capacitors are configured as shown in FIGS. 12A–12B. That is the capacitors $C_{1b}$ and $C_{2b}$ are configured for connection between the input ports 831 and 832. As shown in FIG. 8, the desirable voltage $V_{cm}$ is injected into the common-mode feedback circuit 830 through the input port 831. Similarly, the reference voltage $V_{b4r}$ is injected in to the common-mode feedback circuit 830 through the input port 832. As stated above, the reference voltage $V_{b4r}$ is generated by the diode voltage source 822 and is provided as the proper reference voltage level needed to precisely adjust the actual output common-mode voltage to match the desired voltage level $V_{cm}$. Therefore, during phase 1, the capacitors $C_{1b}$ and $C_{2b}$ sample, or are charged in accordance with, a voltage $V_X$, which is a function of the voltages $V_{cm}$ and $V_{b4r}$ as measured across capacitors $C_{1b}$ and $C_{2b}$.

Also during phase 1, the capacitors $C_{1a}$ and $C_{2a}$ are configured as shown in FIG. 12B. That is, capacitor $C_{1a}$ is connected between the output port OP and the correcting voltage source $V_{b4}$, while the capacitor $C_{2a}$ is connected between the output port ON and the correcting voltage $V_{b4}$. Thus, during phase 1, the capacitors $C_{1a}$ and $C_{2a}$ cooperate to compare the actual common-mode voltage, defined as $(V_A+V_B)/2$, with the voltage $V_X$. The voltage $V_X$ is substantially equal to the desired common-mode voltage $V_{cm}$. This process occurs as the capacitors $C_{1a}$ and $C_{2a}$ discharge across the terminals OP and ON. At this same time, by discharging across OP and ON, the capacitors $C_{1a}$ and $C_{2a}$ correspondingly pull the value of $V_{b4}$ up or down, based upon the difference between $(V_A+V_B)/2$ and $V_X$. The adjusting voltage $V_{b4}$ is then injected into the gates $g_n$ and $g_p$ of the transistors 806 and 815 respectively. The gain factor 1004 is then applied to $V_{b4}$ and in-turn reflected in the common-mode output voltage during the ensuing phase.

In other words, the present invention provides at least two sets of capacitors, insuring that at least one set is parked across the amplifier at any given point in time. While one set of capacitors compares the desired common-mode voltage signal $V_{cm}$ with the reference voltage signal $V_{b4r}$ and charges the capacitors accordingly, another set of capacitors samples the actual output common-mode voltage $(V_A+V_B)/2$ and produces a correcting voltage $V_{b4}$. While one set of capacitors is sampling and comparing the other set of capacitors is discharging and correcting.

Figure 13A:
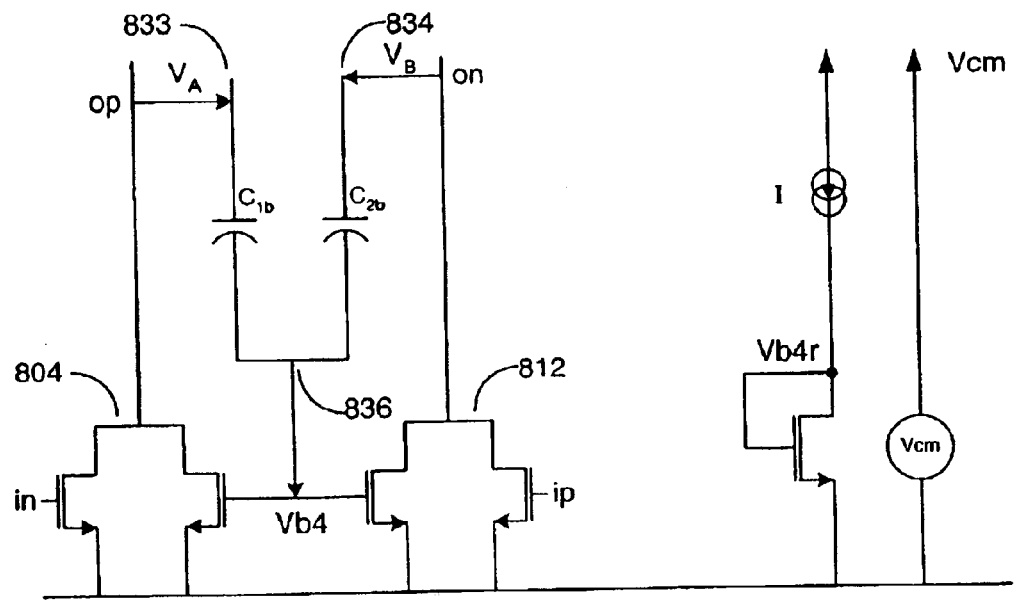
FIG. 13A depicts the first set of switchable capacitors depicted in FIG. 12A configured for operation during timing phase 2.
Figure 13B:
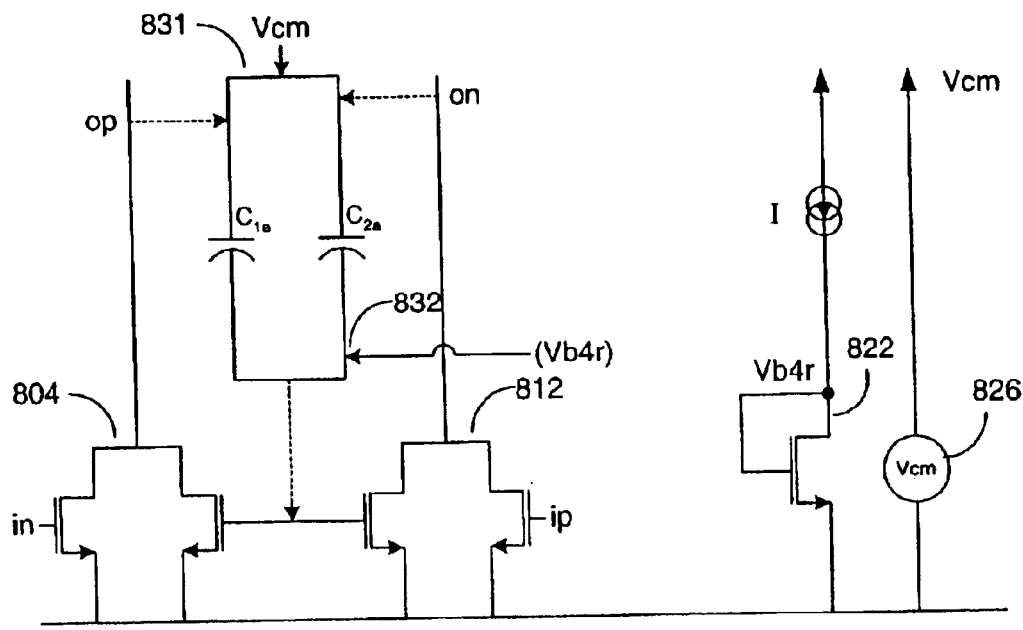
FIG. 13B depicts the second set of switchable capacitors depicted in FIG. 12B configured for operation during timing phase 2.

As stated above, during phase 1 the capacitors $C_{1b}$ and $C_{2b}$ respectively sample the desirable common-mode output voltage signal $V_{cm}$ and the reference voltage signal $V_{b4r}$. During phase 2, however, as shown in FIG. 13A, the capacitors $C_{1b}$ and $C_{2b}$, previously connected between $V_{cm}$ and $V_{b4r}$, are switched to respectively connect across the outputs OP and ON and the adjusting voltage $V_{b4}$. That is during phase 1 capacitors $C_{1b}$ and $C_{2b}$ were charged by voltage $V_X$, a function of $V_{cm}$ and $V_{b4r}$. During phase 2, however, the capacitors $C_{1b}$ and $C_{2b}$ discharge and inject the adjusting voltage $V_{b4}$ into the gates $g_n$ and $g_p$ of the respective transistors 806 and 815. Therefore, using capacitors $C_{1b}$ and $C_{2b}$ as an example, during phase 1 the capacitors are loaded with the correct common-mode voltage level having $V_{cm}$ on one side, and the reference voltage $V_{b4r}$ on the other side.

During phase 2, as shown in FIG. 13A, the capacitors discharge the adjusting voltage $V_{b4}$ and inject $V_{b4}$ into the gates $g_n$ and $g_p$ of the transistors 806 and 815. The parasitic capacitance values of these gates are adjusted in accordance with the gain adjustment factor 1004 shown in FIG. 11. The output common-mode voltage levels are then correspondingly pulled down, or up, in accordance with this value.

During the ensuing phase 1, the desirable voltage level signal $V_{cm}$ is again compared with the actual output common-mode voltage $(V_A+V_B)/2$ as seen at the output terminals OP and ON. If, for example, the actual common-mode voltage is equal to $V_{cm}$ and the reference voltage $V_{b4r}$ is equal to the correcting voltage $V_{b4}$, then no adjustment will be made. If, however, the actual output common-mode voltage is higher than $V_{cm}$, then the fixed voltage $V_X$ across the capacitors $C_{1b}$ and $C_{2b}$ will then pull the middle node $V_{b4}$, correspondingly higher. That is, if the actual output common-mode voltage is higher than the fixed voltage $V_X$, which is substantially equal to $V_{cm}$, the fixed voltage $V_X$ is analogous to placing a battery between each of the terminals 833 and 834 and the output node 836. Therefore; the fixed voltage, behaving as a battery, will also pull the correcting voltage $V_{b4}$ correspondingly higher, which will in turn pull the output common-mode voltage of the amplifier correspondingly lower, since the transistors 806 and 815 act as inverting amplifiers. As previously stated, the capacitors $C_{1b}$ and $C_{2b}$ are ping-ponged between the common-mode feedback circuit 830 in accordance with phase 1 and phase 2.

Therefore the aforementioned process switches between the capacitors $C_{1b}$ and $C_{2b}$ and the capacitors $C_{1a}$ and $C_{2a}$ during the respective phases. Thus, during phase 2, as shown in FIG. 13A, while $C_{1b}$ and $C_{2b}$ are discharging the adjusting voltage $V_{b4}$, the capacitors $C_{1a}$ and $C_{2a}$ are sampling and comparing the actual common-mode voltage, as seen on the output terminals OP and ON, with the desirable common-mode voltage $V_{cm}$. Using the aforementioned structure and technique, the present invention provides an accurate and reliable circuit and method to dynamically sample the common-mode output voltage of an amplifier without tail current compare this output common-mode voltage with a reference signal and adjust the common-mode input voltage in a manner to dynamically adjust the output common-mode voltage to the desirable level. This circuit arrangement and technique therefore creates the ability to compensate for the effects of common-mode type offset voltages caused by variations in electrical characteristics associated with amplifier transistors. The circuit arrangement rejects input common-mode voltages created by the input source or by a previous amplification stage.

The foregoing description of the preferred embodiments provide an illustration and description, but is not intended to be exhaustive or to limit the invention to the precise form disclosed. Modifications or variations are possible consistent with the above teachings or may be acquired from practice of the invention. Thus, it is noted that the scope of the invention is defined by the claims and their equivalents.

What is claimed is:

1. An apparatus comprising:
   capacitor switching means including (i) a plurality of input ports configured to receive a corresponding plurality of input signals therethrough, and (ii) at least one output port configured to output an adjusting signal;
   wherein the corresponding plurality of input signals includes a number of primary signals and two or more reference signals, all of the signals being associated with a first timing phase of operation; and
   wherein the adjusting signal is produced based upon a comparison between the number of primary signals and at least one of the reference signals; and
   gain producing means configured to (i) receive the adjusting signal, (ii) provide a gain to the received adjusting signal in accordance with a predetermined gain factor, and (iii) facilitate an adjustment to the number of primary signals based upon the gain during a second timing phase of operation.

2. The apparatus of claim 1, wherein the capacitor switching means includes at least two pairs of capacitors, capacitors of each pair being connected together by configurable switches; and
   wherein the switches are configured to switch the pairs of capacitors in accordance with the first and second timing phases.

3. The apparatus of claim 1, wherein the apparatus is an amplifier;
   wherein the primary signals are amplifier output signals; and
   wherein the two or more reference signals include a fixed level voltage signal having a desirable voltage level and a reference voltage signal having a voltage level substantially equal to a difference between a voltage level of the amplifier output signals and the fixed level voltage signal.

4. The apparatus of claim 3, wherein the gain producing means includes a pair of active devices; and
   wherein the active devices are transistors.

5. The apparatus of claim 4, wherein the transistors are N-channel metal oxide semiconductor field effect transistors.

6. The apparatus of claim 3, wherein the amplifier is without a tail current source and is of a telescopic variety.

7. An apparatus for adjusting output common-mode voltages in an amplifier, the amplifier including at least a common-mode feedback module having input ports coupled to amplifier output ports and having an output port coupled to gates of a first pair of transistors, the common-mode feedback module being configured to switch between two or more timing phases of operation, gates of the first pair of transistors being connected together to form an adjusting signal input node, drains of the first pair of transistors being connected to drains of a second pair of transistors, and gates of the second pair of transistors forming amplifier input ports, the apparatus comprising:
   means for receiving a number of reference voltage signals and output signals as inputs in the common-mode feedback module;
   means for comparing the reference voltage signals with the output signals and producing an adjusting signal thereby, the comparing occurring during a first of the two or more timing phases;
   means for receiving the adjusting signal in the first pair of transistors via the adjusting signal input node;
   means for applying a gain to the adjusting signal in the first pair of transistors, the gain being based upon a first predetermined gain factor; and
   means for adjusting the output signals in accordance with the applying during a second of the two or more timing phases.

8. The apparatus of claim 7, further comprising means for receiving respective input signals at the amplifier input ports, the second pair of transistors applying a gain to the respective input signals in accordance with a second predetermined gain factor.

9. The apparatus of claim 8, wherein the first and second predetermined gain factors are related.

10. The apparatus of claim 9, wherein a sum of the first and second predetermined gain factors is substantially equal to one.

11. The apparatus of claim 10, wherein one of the first and second predetermined gain factors is ¼th and the other of the first and second predetermined gain factors is ¾ths.

* * * * *